United States Patent
Chang et al.

(10) Patent No.: US 6,778,879 B2
(45) Date of Patent: Aug. 17, 2004

(54) AUTOMATED MATERIAL HANDLING SYSTEM AND METHOD OF USE

(75) Inventors: Ko-Pin Chang, Tainan (TW); Ming Wang, Junghe (TW); Jui-An Shih, Kaohsiung (TW); Jim Chue, Putz (TW); Jason Liu, Yungkang (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/268,379

(22) Filed: Oct. 10, 2002

(65) Prior Publication Data

US 2004/0073331 A1 Apr. 15, 2004

(51) Int. Cl.⁷ ................................................ G06F 7/00
(52) U.S. Cl. ........................................ 700/223; 700/228
(58) Field of Search .............................. 700/223, 225, 700/228; 414/935, 940, 416, 442; 209/573

(56) References Cited

U.S. PATENT DOCUMENTS 5,751,581 A * 5/1998 Tau et al. ................... 700/225
6,392,403 B1 * 5/2002 Conboy et al. ............ 324/158.1
6,591,162 B1 * 7/2003 Martin ........................ 700/228

* cited by examiner

Primary Examiner—Gene O. Crawford
(74) Attorney, Agent, or Firm—Tung & Associates

(57) ABSTRACT

The present invention provides an automated material handling system (AMHS) having: a FOUP management system, for managing a plurality of multiple lot FOUPs; a real time dispatch system for controlling dispatching of wafer lot orders within a wafer fabrication system; an automatic material handling integration system having a stocker for storing and sequencing a plurality of FOUPs, the stocker having an embedded sorter disposed there within for sorting wafers within a plurality of multiple lot FOUPs, and a FOUP transportation system for transporting FOUPs within a wafer fabrication facility; a manufacture execution system in operative communication with the real time dispatch system for controlling recipe processing and for controlling flow of FOUPs within the FAB; and a computer integrated manufacturing system for automating equipment within the AMHS. Additionally provided is a methodology for using the embedded sorter to sort FOUPs and a plurality of wafers within the AMHS.

25 Claims, 1 Drawing Sheet

AUTOMATED MATERIAL HANDLING SYSTEM AND METHOD OF USE

FIELD OF THE INVENTION

The present invention is directed to an automated material handling system and method of use for improving wafer processing within an automated wafer fabrication FAB.

BACKGROUND

Existing sorter operations within an automated wafer fabrication facility (FAB) are not integrated with an automatic material handling system (AMHS). This causes 1) an operator error risk because an operator cannot get enough information to collect and verify wafer map information for precisely supporting wafer level control; 2) low productivity because an operator is responsible for combining, separating, merging, and splitting lots resulting in a heavy operator workload and a bottleneck in the fabrication process; and 3) difficulty in controlling and managing wafer holding devices, wherein the wafer holding devices are typically Front Opening Unified Pods (FOUP) typically, capable of holding up to 25 wafers.

In an existing automated FAB, FOUPs are transferred to fabrication equipment and to sorter load ports via a FOUP transportation system having an overhead transport system in a sequential order in accordance with lot orders communicated from a real time dispatching system. Existing systems have an associated sorter in communication with piece of fabrication equipment, wherein all sorting of FOUPs and wafers within the FOUPs are done in sequence according to a real time dispatching queue. Typically each piece of fabrication equipment has an associated sorter in communication with an equipment's load port for sorting through wafer cassettes holding wafer lots waiting to be processed by the associated piece of fabrication equipment. Lots not queued for processing within the associated piece of fabrication equipment would remain in a wafer cassette within an associated FOUP, wherein the associated FOUP is routed to the sorter and then the overhead transport system for transporting the FOUP to another piece of fabrication equipment for further processing.

It is desirable to design a special embedded sorter that has a load port embedded into a AMHS stocker, wherein the AMHS system can transfer a FOUP to the embedded sorter's load port via a stocker crane instead of by the OHT to prevent bottlenecks from occurring during sorting of wafers.

It is desirable to provide an embedded sorter designed to reduce a bottleneck in intrabay or interbay transportation.

It is desirable to provide a sorter automation system to automate splitting, merging, FOUP exchanges, FOUP cleanings, and wafer map verifications to improve production throughput and to reduce mis-operation.

To improve an equipment's utilization and production throughput, an automatic material handling system (AMHS) in a full automated fab provided to perform multiple lot per carrier operations in a full automated fab, preferably in a 300 mm fab. The AMHS has an AMHS integrated system is integrated with a stocker having an embedded sorter, the stocker in communication with a manufacture execution system (MES), with a real time dispatching system, and with an equipment automation (EA) or a computer integrated manufacturing system to allow for wafer processing by a piece of fabrication equipment without additional sorting or manipulation by the piece of fabrication equipment.

SUMMARY OF THE INVENTION

The present invention provides an automated material handling system having:
- a FOUP management system, the FOUP management system for managing a plurality of FOUPs;
- a real time dispatch system, the real time dispatch system for controlling dispatching of wafer lot orders within a wafer fabrication system, wherein the real time dispatch system is in operative communication with the FOUP management system,
- an automatic material handling integration system, the automatic material handling system integration system having
- a stocker for storing and sequencing a plurality of FOUPs, the stocker having an embedded sorter disposed there within for sorting wafers within the plurality of FOUPs, wherein the stocker is in operative communication with the real time dispatch system and is in further operative communication with a computer integrated manufacturing system, and
- a FOUP transportation system for transporting FOUPs within a wafer fabrication facility, the FOUP transportation system in operative communication with the stocker and in further operative communication with the real time dispatch system to route FOUPs to and from the embedded sorter;
- a manufacture execution system, the manufacture execution system in operative communication with the real time dispatch system for controlling recipe processing and for controlling flow of FOUPs within the FAB; and
- a computer integrated manufacturing system, the computer integrated manufacturing system for automating equipment, the computer integrated manufacturing system in operative communication with the stocker and with the manufacture execution system, wherein the computer integrated manufacturing is in further operative communication with the real time dispatch.

Preferably, the real time dispatch system has an operation job supervisor, wherein the operation job supervisor has a software decision engine that coordinates with the real time dispatch system to allow for full automation of wafer lot orders within a fabrication facility.

In another preferred embodiment, the stocker has a stocker crane, and at least two load ports in communication with the FOUP transportation system and in further communication with the embedded sorter.

In an additional preferred embodiment, the embedded sorter has at least four load ports, wherein two of the at least four embedded sorter load ports are stocker crane accessible load ports, the two stocker crane accessible load ports in operative communication with the FOUP transportation system for automatically transferring FOUPs from the stocker crane to at least one of the embedded sorter's two stocker crane accessible load ports according to a predefined sequence, and wherein two of the at least four embedded sorter load ports are operator accessible load ports, the embedded sorter's two operator accessible load ports are provided to allow for manual insertion of FOUPs by an operator into the embedded sorter; and
- a embedded sorter automation system for controlling a FOUP operation scenario to be performed on a FOUP disposed within the embedded sorter.

The embedded sorter automation system operates to transfer at least one FOUP automatically from the stocker crane to at least one of the at least two stocker crane accessible load ports when the real time dispatch system is in an automated mode and operates to transfer at least one FOUP manually from an operator to at least one of the at least two operator accessible load ports when the real time dispatch system is operating in a manual mode.

Additionally, the embedded sorter automation system is capable of performing a FOUP operation scenario in accordance with instructions communicated to the embedded sorter from the manufacture execution system, the FOUP operation scenario selected from the group consisting of:

a FOUP separation scenario, a FOUP exchange scenario, a FOUP combination scenario, a FOUP cleaning due scenario, and a wafer map verification scenario.

Also, preferably, the FOUP transportation system is in operative communication with the stocker and in further operative communication with the real time dispatch system, wherein the FOUP transportation system has:

a plurality of overhead shuttles for transporting a plurality of FOUPs within a wafer fabrication facility, and an overhead transport system providing a routing system having a plurality of predefined routes for routing the plurality of overhead shuttles, the plurality of overhead shuttles and the overhead transport system cooperate to transport a plurality of FOUPs within a wafer FAB.

A method of using the AMHS of the present invention is disclosed. The method has the steps of:

a) providing an automated material handling system having a FOUP management system for managing a plurality of multiple lot FOUPs, wherein each of the plurality of multiple lot FOUPs has associated tag information for one or a plurality of lots disposed within each multiple lot FOUP a real time dispatching system having an operation job supervisor for controlling dispatching of wafer lot orders, an automatic material handling system integration system having a stocker, the stocker having two stocker load ports, an embedded sorter, wherein the embedded sorter has four embedded load ports, and a FOUP transportation system, a material execution system, and a computer integrated manufacturing system;

b) transferring a multiple lot FOUP from the FOUP management system to the embedded sorter;

c) using the embedded sorter to perform at least one FOUP automation scenario defined by the manufacture execution system on the multiple lot FOUP disposed within the embedded sorter;

d) completing at least one FOUP automation scenario on a FOUP disposed within the embedded sorter; and e) transferring a sorted multiple lot FOUP from the embedded sorter to the FOUP transportation system.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENTS

Figure 1:
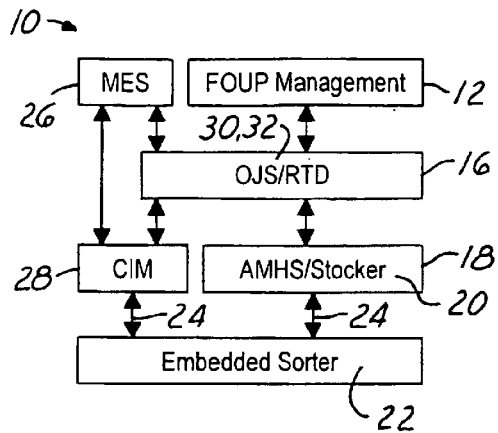
FIG. 1 is an overview of an automated material handling system in accordance with the present invention.

Referring now to the drawings, FIG. 1 illustrates an overview of an automatic material handling system (hereinafter "AMHS") 10 in accordance with the present invention. As shown in FIG. 1, the present invention discloses an automated material handling system (hereinafter "AMHS") 10 having the following integrated components:

a front opening unit pod (hereinafter "FOUP") management system 12, the FOUP management system 12 for managing a plurality of FOUPs 14;

a real time dispatch system (RTD system) 16, the RTD system 16 for controlling dispatching of wafer lot orders within a wafer fabrication system, wherein the RTD system 16 is in operative communication with the FOUP management system 12, an AMHS integration system 18, the AMHS integration system 18 having a stocker 20 for storing and sequencing a plurality of FOUPs 14, the stocker 20 having an embedded sorter 22 disposed there within for sorting wafers within the plurality of FOUPs, wherein the stocker 20 is in operative communication with the RTD system 16 and is in further operative communication with a CIM system, and a FOUP transportation system 24 for transporting FOUPs within a wafer fabrication facility, the FOUP transportation system 24 in operative communication with the stocker 20 and in further operative communication with the RTD system 16 to route FOUPs to and from the embedded sorter 22;

a manufacture execution system (hereinafter "MES") 26, the MES 26 in operative communication with the RTD system 16 for controlling recipe processing and for controlling flow of a plurality of FOUPs 14 within the FAB; and a CIM system 28, the CIM system 28 for automating equipment, the CIM system 28 in operative communication with the stocker 20 and with the MES 26, wherein the CIM 28 is in further operative communication with the RTD 16.

The FOUP management system 12 is capable of managing empty FOUPS, back-end, and front-end FOUPs. Preferably, each FOUP within a wafer FAB is a multiple lot FOUP having associated tag information identifying lots disposed within the multiple lot FOUP.

The RTD system 16 provides an operation job supervisor 30, the OJS 30 providing a software decision engine 32 that coordinates with the RTD system 16 to allow for full automation of wafer lot orders within a fabrication facility.

The RTD system 16 is in communication with the FOUP management system 12 and with the AMHS integration system 18. The RTD system 16 dispatches a correct lot order to a piece of fabrication equipment for processing by determining routing of a wafer lot when the lot has been processed by a piece of fabrication equipment, the RTD system 16 communicates with the OJS 20 to transfer one of a plurality of FOUPs 14 to a piece of fabrication equipment using a FOUP transportation system as described further below. The piece of fabrication equipment may include the stocker 20 and the associated embedded sorter 22. When the piece of fabrication equipment specified by the RTD system 16 is the embedded sorter 22, the OJS 20 adds the embedded sorter as a piece of fabrication equipment for processing of the FOUP and communicates with the CIM system 28 to identify the embedded sorter 22 as the piece of fabrication equipment for wafer processing.

Figure 2:
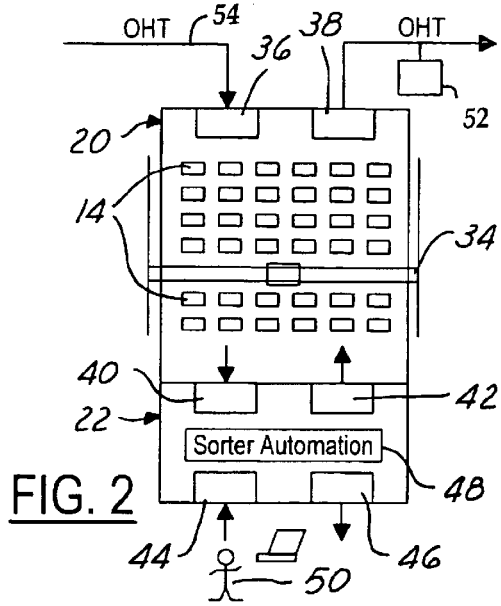
FIG. 2 is an enlarged view of a stocker having an embedded stocker disposed within the automated material handling system of FIG. 1.

Referring now to FIG. 2, illustrating an enlarged view of the AMHS integration system 18 of FIG. 1. As shown in FIG. 2, the AMHS integration system 18 has the stocker 20 for storing and sequencing a plurality of FOUPs 14, the stocker 20 having the embedded sorter 22 for performing a FOUP operation scenario on the plurality of FOUPs 14, and a FOUP transportation system 32 in operative communication with the stocker 20 for transporting a plurality of FOUPs 14 within a wafer fabrication facility.

Preferably, the stocker 20 has a stocker crane 34, and at least two stocker load ports 36, 38 in communication with the FOUP transportation system 32 and in further communication with the embedded sorter 22. The at least two stocker load ports 36, 38 replicate a piece of fabrication equipment's load port and operate to transfer a FOUP from the stocker 22 to the FOUP transportation system 32 for transporting the FOUP to a piece of fabrication equipment. The stocker 20 further operates to transfer a FOUP or a plurality of FOUPs 14 from one of the at least two stocker load ports 36, 38 via the stocker crane 34 to the embedded sorter 22 for further processing of the FOUP or the plurality of FOUPs 14 and for processing of associated wafer lot orders (not shown) within the FOUP or the plurality of FOUPs.

The embedded sorter 22 is provided to reduce bottlenecks that frequently occur in intrabay or interbay transportation. The embedded sorter 22 has at least four embedded sorter load ports 40, 42, 44, 46, wherein two of the at least four embedded sorter load ports are provided for stocker crane access 40, 42 respectively, and wherein two of the at least four embedded sorter load ports are provided for operator access 44, 46 respectively, and a sorter automation system 48 for controlling a FOUP operation scenario to be performed on a FOUP disposed within the embedded sorter 22.

The embedded sorter 22 operates to exchange wafers between the four embedded sorter load ports 40, 42, 44, 46 according to processing requirements of each lot disposed within a plurality of multiple lot FOUPs 14 using a plurality of automated functions communicated to the sorter automation system 48 from the MES 26 to improve throughput and to reduce mis-operation. The embedded sorter's two stocker crane accessible load ports 40, 42 are in operative communication with the FOUP transportation system for automatically transferring FOUPs from the stocker crane 34 to at least one of the embedded sorter's two stocker crane accessible load ports 40, 42 according to a predefined sequence, wherein the sequence is defined by the RTD system 16, and wherein the embedded sorter's two operator accessible load ports 44, 46 are provided to allow for manual insertion of FOUPs by an operator 50 into the embedded sorter 22.

The sorter automation system 48 is capable of supporting a multiple lots per FOUP operation, thus, providing an effective approach to improving equipment utilization and productivity, and to reducing FOUP inventory. The sorter automation system 48 operates to transfer a FOUP or a plurality of FOUPs 14 automatically from the stocker crane 34 to at least one of the at least two stocker crane accessible load ports 40, 42 when the RTD system 16 is operating in an automatic mode or manually from an operator 50 to at least one of the at least two operator accessible load ports 44, 46 when the RTD system 16 is operating in a manual mode. When the FOUP 14 is transferred from one of the at least two stocker load ports 36, 38 to one of the stocker crane accessible embedded sorter load ports 40, 42 by the stocker crane, the transfer is performed preferably according to an E84/E87 SEMI-standard.

In operation, preferably two FOUPS, a FOUP having identifying tag information (not shown), and an empty FOUP (not shown) are loaded into one of the embedded sorter's stocker crane accessible two load ports 40, 42 automatically by the stocker crane 34 according to a predefined sequence or optionally, into one of the embedded sorter's at least two operator accessible load ports 44, 46 manually by an operator 50. After the FOUP or the plurality of FOUPs have been loaded into the embedded sorter 22, the sorter automation system 48 performs a FOUP operation scenario in accordance with instructions communicated to the embedded sorter 22 from the MES 26, preferably the FOUP operation scenario is selected from the group consisting a FOUP separation scenario, a FOUP exchange scenario, a FOUP combination scenario, a FOUP cleaning due scenario, and a wafer map verification scenario. Preferably, the FOUP separation scenario is performed using an auto wafer lot split function, the FOUP exchange scenario is performed using a FOUP exchange function, the FOUP combination scenario is performed using a wafer lot merge function, the FOUP cleaning due scenario is performed using a FOUP cleaning due function, and the wafer map verification scenario performed using a wafer map verification function. However, additional FOUP operation scenarios and functions may be added to enhance wafer processing within an automated FAB.

The FOUP transportation system 24 operates to transport FOUPs within a wafer fabrication facility, the FOUP transportation system is in operative communication with the stocker 20 and is in further operative communication with the RTD system 16. The FOUP transportation system 24 has a plurality of overhead shuttles (OHS) 52 for transporting a plurality of FOUPs within a wafer fabrication facility, and an overhead transport system (OHT system) 54 providing a routing system having a plurality of predefined routes for routing the plurality of OHS 52, the plurality of OHS 52 and the OHT system 54 cooperate to transport a plurality of FOUPs 14 within the FAB.

The MES 26 is capable of providing for multiple lot operation scenarios using a software engine such as but not limited to SiVIEW, the multiple lot operation scenarios providing for lot combining or merging; lot separation or splitting, wafer exchange, FOUP cleaning due, and wafer map verification as described herein above. The MES 26 is in operative communication with the RTD system 16 and is in further operative communication with the CIM system 28 for controlling recipe combinations and for controlling flow of FOUPs within a FAB.

The CIM 28 is in communication with the MES 26 to communicate FOUP operation scenarios to the embedded sorter 22 according to a recipe provided by the MES 26.

Figure 3:
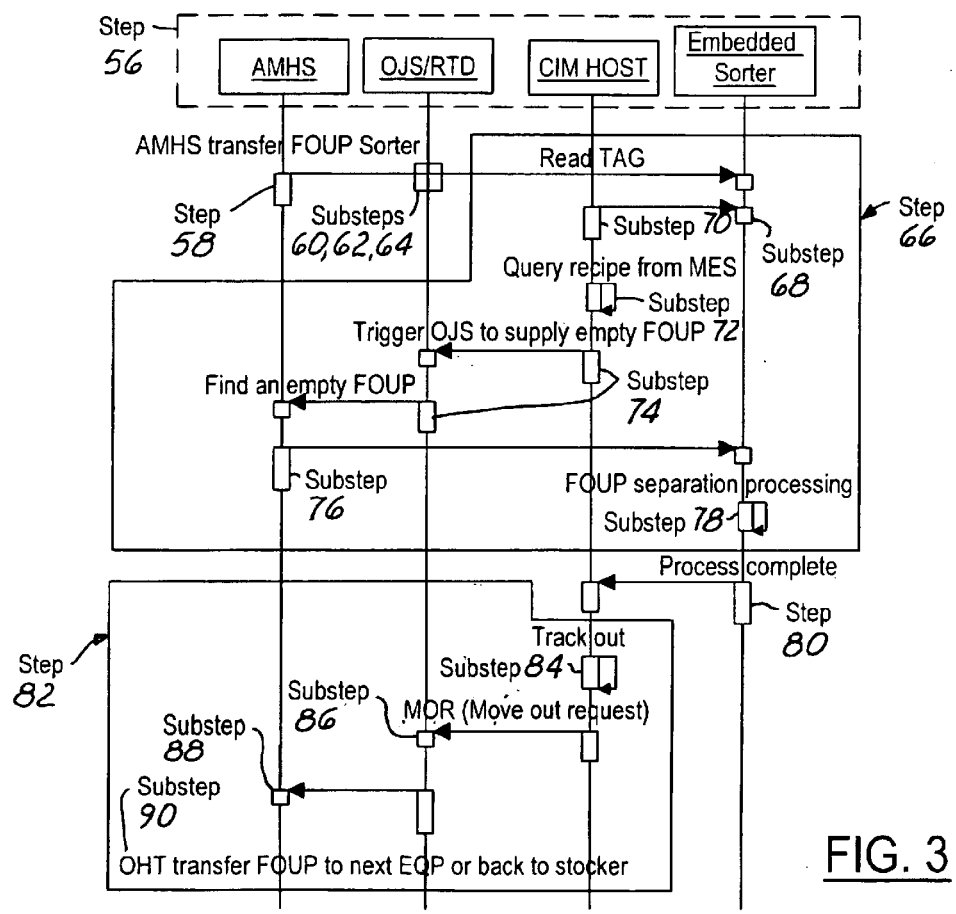
FIG. 3 is an overview of process steps used to perform a method of using the AMHS of FIG. 1 to process and sort FOUPs and wafers within a wafer fabrication facility.

Referring now to FIG. 3, a method of using sorter to sort a plurality of FOUPs and wafers disposed within the plurality of FOUPs according to processing requirements of wafer lot orders to increase productivity of a wafer fabrication process is shown. The method has the steps of:

a) providing an automated material handling system having
   a FOUP management system for managing a plurality of multiple lot FOUPs, wherein each of the plurality of multiple lot FOUPs has associated tag information for one or a plurality of lots disposed within each multiple lot FOUP (step 56),
   a real time dispatching system (RTD system) having an operation job supervisor for controlling dispatching of wafer lot orders, an AMHS integration system having a stocker, the stocker having two stocker load ports, and an embedded sorter, wherein the embedded sorter has four embedded load ports,
a FOUP transportation system,
a material execution system, and
a CIM system;

b) transferring a multiple lot FOUP from the FOUP management system to the embedded sorter, the multiple lot FOUP having associated tag information for one or a plurality of lots disposed within the multiple lot FOUP (step 58), wherein the step of transferring a multiple lot FOUP from the FOUP management system to the embedded sorter load preferably has the substeps of:
  i) using the RTD system to determine a wafer lot order destination for a wafer lot disposed within a multiple lot FOUP (substep 60),
  ii) using the OJS to transfer lots disposed within the multiple lot FOUP according to the lot destination of at least one of the two stocker load ports communicated by the RTD system to the OJS (substep 62), and
  iii) transferring the multiple lot FOUP from one of the two stocker load ports to at least one of the four embedded sorter load ports disposed within the embedded sorter when the RTD specifies the embedded sorter as the lot destination (substep 64);

c) using the embedded sorter to perform at least one FOUP automation scenario defined by the MES on the multiple lot FOUP disposed within the embedded sorter (step 66), the step of using the embedded sorter to perform at least one FOUP automation scenario preferably has the substeps of:
  i) reading tag information from the multiple lot FOUP for one or a plurality of lots disposed within the multiple lot FOUP (substep 68),
  ii) sending the tag information from the multiple lot FOUP to the CIM system (substep 70),
  iii) using the CIM system to query a recipe combination and an associated FOUP automation scenario from the MES to the embedded sorter (substep 72),
  iv) using the CIM system to communicate to the OJS to supply an empty FOUP from the FOUP management system to at least one of the embedded sorter's four load ports (substep 74),
  v) using the AMHS integration system to transfer an empty FOUP from the FOUP management system to at least one of the four embedded sorter load ports (substep 76), and
  vi) performing at least one FOUP automation scenario operation on the empty FOUP and on the multiple lot FOUP having the associated tag information in accordance with the associated FOUP automation scenario defined by the MES, the FOUP operation scenario selected from the group consisting of a FOUP separation scenario, a FOUP exchange scenario, a FOUP combination scenario, a FOUP cleaning due scenario, and a wafer map verification scenario (substep 78);

d) completing at least one FOUP automation scenario on a FOUP disposed within the embedded sorter (step 80); and e) transferring a sorted multiple lot FOUP from the embedded sorter to the FOUP transportation system (step 82), the step of transferring the sorted multiple lot FOUP from the embedded sorter to the FOUP transportation system having the substeps of:
  i) tracking a sorted multiple lot FOUP that completed the FOUP automation scenario out of the embedded sorter using the CIM system (substep 84),
  ii) sending a move out request to the OJS from the embedded sorter to transfer the sorted multiple lot FOUP to a piece of fabrication equipment, wherein the sorted FOUPs are (substep 86), and
  iii) using the OJS to send the sorted multiple lot to a piece of fabrication equipment via the FOUP transportation system (substep 88), wherein the substep of using the OJS to send the sorted multiple lot FOUP to a piece of fabrication equipment via the FOUP transportation system has a further step of:
    using an overhead shuttle in communication with an overhead transport system to send the sorted multiple lot FOUP to at least one of the two stocker load ports (substep 90), wherein the piece of fabrication optionally is the stocker.

From the foregoing, it should be appreciated that a system and method is provided for improving processing of wafers within a wafer fabrication facility. While a preferred exemplary embodiment has been presented in the foregoing detailed description, it should be understood that a vast number of variations exist and this preferred exemplary embodiment is merely an example, and it is not intended to limit the scope, applicability or configuration of the invention in any way. Rather, the foregoing detailed description provides those of ordinary skill in the art with a convenient guide for implementing a preferred embodiment of the invention and various changes can be made in the function and arrangements of the exemplary embodiment without departing from the spirit and scope of the appended claims.

What is claimed is:

1. An automated material handling system comprising:
  a FOUP management system, the FOUP management system for managing a plurality of FOUPs;
  a real time dispatch system, the real time dispatch system for controlling dispatching of wafer lot orders within a wafer fabrication system, wherein the real time dispatch system is in operative communication with the FOUP management system, an automatic material handling integration system, the automatic material handling system integration system having
    a stocker for storing and sequencing a plurality of FOUPs, the stocker having an embedded sorter disposed there within for sorting wafers within the plurality of FOUPs, the embedded sorter having at least four load ports, wherein two of the at least four embedded sorter load ports are stocker crane accessible load ports, the two stocker crane accessible load ports in operative communication with the FOUP transportation system for automatically transferring FOUPs from the stocker crane to at least one of the embedded sorter's two stocker crane accessible load ports according to a predefined sequence, and wherein two of the at least four embedded sorter load ports are operator accessible load ports, the embedded sorter's two operator accessible load ports are provided to allow for manual insertion of FOUPs by an operator into the embedded sorter, and
    wherein the stocker is in operative communication with the real time dispatch system and is in further operative communication with a computer integrated manufacturing system; and
  a FOUP transportation system for transporting FOUPs within a wafer fabrication facility, the FOUP transportation system in operative communication with the stocker and in further operative communication with the real time dispatch system to route FOUPs to and from the embedded sorter;

a manufacture execution system, the manufacture execution system in operative communication with the real time dispatch system for controlling recipe processing and for controlling flow of FOUPs within the FAB; and a computer integrated manufacturing system, the computer integrated manufacturing system for automating equipment, the computer integrated manufacturing system in operative communication with the stocker and with the manufacture execution system, wherein the computer integrated manufacturing is in further operative communication with the real time dispatch system.

2. The system of claim 1 wherein the real time dispatch system comprises:

an operation job supervisor, the operation job supervisor having a software decision engine that coordinates with the real time dispatch system to allow for full automation of wafer lot orders within a fabrication facility.

3. The automatic material handling system of claim 1 wherein the FOUP transportation system is in operative communication with the stocker and in further operative communication with the real time dispatch system, the FOUP transportation system comprising:

a plurality of overhead shuttles for transporting a plurality of FOUPs within a wafer fabrication facility, and an overhead transport system providing a routing system having a plurality of predefined routes for routing the plurality of overhead shuttles, the plurality of overhead shuttles and the overhead transport system cooperate to transport a plurality of FOUPs within a wafer FAB.

4. The system of claim 1 wherein the stocker has a stocker crane, and at least two load ports in communication with the FOUP transportation system and in further communication with the embedded sorter, and wherein the stocker crane is used to transfer at least one FOUP from one of the at least two stocker load ports to the embedded sorter for further processing of the at least one FOUP and for processing of associated wafer lot orders within the at least one FOUP.

5. The system of claim 4 wherein the at least one FOUP is a multiple lot FOUP having associated tag information identifying lots disposed within the at least one multiple lot FOUP.

6. The system of claim 1 wherein the embedded sorter further comprises:

an embedded sorter automation system for controlling a FOUP operation scenario to be performed on a FOUP disposed within the embedded sorter.

7. The system of claim 6, wherein the embedded sorter operates to exchange wafers between the at least four embedded sorter load ports according to processing requirements of each lot disposed within a plurality of multiple lot FOUPs using a plurality of automated functions communicated to the embedded sorter automation system from the manufacture execution system to improve throughput and to reduce mis-operation.

8. The automatic material handling system of claim 7, wherein the embedded sorter automation system is capable of performing a FOUP operation scenario in accordance with instructions communicated to the embedded sorter from the manufacture execution system, the FOUP operation scenario selected from the group consisting of:

a FOUP separation scenario,
a FOUP exchange scenario,
a FOUP combination scenario,
a FOUP cleaning due scenario, and
a wafer map verification scenario.

9. The automatic material handling system of claim 7 wherein the embedded sorter automation system operates to transfer at least one FOUP automatically from the stocker crane to at least one of the at least two stocker crane accessible load ports when the real time dispatch system is in an automated mode.

10. The automatic material handling system of claim 9 wherein the embedded sorter automation system operates to transfer at least one FOUP manually from an operator to at least one of the at least two operator accessible load ports when the real time dispatch system is operating in a manual mode.

11. A method of using an automated material handling system to process wafers within a wafer fabrication facility comprising the steps of:

a) providing an automated material handling system having
a FOUP management system for managing a plurality of multiple lot FOUPs, wherein each of the plurality of multiple lot FOUPs has associated tag information for one or a plurality of lots disposed within each multiple lot FOUP
a real time dispatching system having an operation job supervisor for controlling dispatching of wafer lot orders,
an automatic material handling system integration system having a stocker, the stocker having
two stocker load ports,
an embedded sorter, wherein the embedded sorter has four embedded load ports, and
a FOUP transportation system,
a material execution system, and
a computer integrated manufacturing system;

b) transferring a multiple lot FOUP from the FOUP management system to the embedded sorter;

c) using the embedded sorter to perform at least one FOUP automation scenario defined by the manufacture execution system on the multiple lot FOUP disposed within the embedded sorter;

d) completing at least one FOUP automation scenario on a FOUP disposed within the embedded sorter; and e) transferring a sorted multiple lot FOUP from the embedded sorter to the FOUP transportation system.

12. The method of claim 11, wherein the step of transferring a multiple lot FOUP from the FOUP management system to the embedded sorter load comprises the substeps of:

a) using the real time dispatch system to determine a wafer lot order destination for a wafer lot disposed within a multiple lot FOUP, b) using the operation job supervisor to transfer lots disposed within the multiple lot FOUP according to the lot destination of at least one of the two stocker load ports communicated by the real time dispatch system to the operation job supervisor, and c) transferring the multiple lot FOUP from one, of the two stocker load ports to at least one of the four embedded sorter load ports disposed within the embedded sorter when the real time dispatch specifies the embedded sorter as the lot destination.

13. The method of claim 12 wherein the step of using the embedded sorter to perform at least one FOUP automation scenario preferably has the substeps of:

a) reading tag information from the multiple lot FOUP for one or a plurality of lots disposed within the multiple lot FOUP, b) sending the tag information from the multiple lot FOUP to the computer integrated manufacturing system, c) using the computer integrated manufacturing system to query a recipe combination and an associated FOUP automation scenario from the manufacture execution system to the embedded sorter, d) using the computer integrated manufacturing system to communicate to the operation job supervisor to supply an empty FOUP from the FOUP management system to at least one of the embedded sorter's four load ports, e) using the automatic material handling system integration system to transfer an empty FOUP from the FOUP management system to at least one of the four embedded sorter load ports, and f) performing at least one FOUP automation scenario operation on the empty FOUP and on the multiple lot FOUP having the associated tag information in accordance with the associated FOUP automation scenario defined by the manufacture execution system, the FOUP operation scenario selected from the group consisting of a FOUP separation scenario, a FOUP exchange scenario, a FOUP combination scenario, a FOUP cleaning due scenario, and a wafer map verification scenario.

14. The method of claim 13 wherein the step of transferring the sorted multiple lot FOUP from the embedded sorter to the FOUP transportation system comprising the substeps of:

a) tracking a sorted multiple lot FOUP that completed the FOUP automation scenario out of the embedded sorter using the computer integrated manufacturing system;

b) sending a move out request to the operation job supervisor from the embedded sorter to transfer the sorted multiple lot FOUP to a piece of fabrication equipment; and c) using the operation job supervisor to send the sorted multiple lot to a piece of fabrication equipment via the FOUP transportation system.

15. The method of claim 14 wherein the step of using the operation job supervisor to send the sorted multiple lot FOUP to a piece of fabrication equipment via the FOUP transportation system comprises:

using an overhead shuttle in communication with an overhead transport system to send the sorted multiple lot FOUP to at least one of the two stocker load ports.

16. A method of using an automated material handling system to process wafers within a wafer fabrication facility comprising the steps of:

a) providing an automated material handling system having
 a FOUP management system for managing a plurality of multiple lot FOUPs,
 a real time dispatching system having an operation job supervisor for controlling dispatching of wafer lot orders,
 an automatic material handling system integration system having a stocker, the stocker having
  two stocker load ports,
  an embedded sorter, wherein the embedded sorter has four embedded load ports, and
  a FOUP transportation system,
 a material execution system, and
 a computer integrated manufacturing system;

b) transferring a multiple lot FOUP from the FOUP management system to the embedded sorter, the multiple lot FOUP having associated tag information for one or a plurality of lots disposed within the multiple lot FOUP, wherein the step of transferring a multiple lot FOUP from the FOUP management system to the embedded sorter load has the substeps of:
 i) using the real time dispatch system to determine a wafer lot order destination for a wafer lot disposed within a multiple lot FOUP,
 ii) using the operation job supervisor to transfer lots disposed within the multiple lot FOUP according to the lot destination of at least one of the two stocker load ports communicated by the real time dispatch system to the operation job supervisor,
 iii) transferring the multiple lot FOUP from one of the two stocker load ports to at least one of the four embedded sorter load ports disposed within the embedded sorter when the real time dispatch specifies the embedded sorter as the lot destination;

c) using the embedded sorter to perform at least one FOUP automation scenario defined by the manufacture execution system on the multiple lot FOUP disposed within the embedded sorter, the step of using the embedded sorter to perform at least one FOUP automation scenario preferably has the substeps of:
 i) reading tag information from the multiple lot FOUP for one or a plurality of lots disposed within the multiple lot FOUP,
 ii) sending the tag information from the multiple lot FOUP to the computer integrated manufacturing system,
 iii) using the computer integrated manufacturing system to query a recipe combination and an associated FOUP automation scenario from the manufacture execution system to the embedded sorter,
 iv) using the computer integrated manufacturing system to communicate to the operation job supervisor to supply an empty FOUP from the FOUP management system to at least one of the embedded sorter's four load ports,
 v) using the automatic material handling system integration system to transfer an empty FOUP from the FOUP management system to at least one of the four embedded sorter load ports, and
 vi) performing at least one FOUP automation scenario operation on the empty FOUP and on the multiple lot FOUP having the associated tag information in accordance with the associated FOUP automation scenario defined by the manufacture execution system, the FOUP operation scenario selected from the group consisting of a FOUP separation scenario, a FOUP exchange scenario, a FOUP combination scenario, a FOUP cleaning due scenario, and a wafer map verification scenario, d) completing at least one FOUP automation scenario on a FOUP disposed within the embedded sorter; and e) transferring a sorted multiple lot FOUP from the embedded sorter to the FOUP transportation system, the step of transferring the sorted multiple lot FOUP from the embedded sorter to the FOUP transportation system having the substeps of:
 i) tracking a sorted multiple lot FOUP that completed the FOUP automation scenario out of the embedded sorter using the computer integrated manufacturing system,
 ii) sending a move out request to the operation job supervisor from the embedded sorter to transfer the sorted multiple lot FOUP to a piece of fabrication equipment, and iii) using the operation job supervisor to send the sorted multiple lot to a piece of fabrication equipment via the FOUP transportation system, wherein the substep of using the operation job supervisor to send the sorted multiple lot FOUP to a piece of fabrication equipment via the FOUP transportation system has a further step of:

using an overhead shuttle in communication with an overhead transport system to send the sorted multiple lot FOUP to at least one of the two stocker load ports.

17. An automated material handling system comprising:
an automatic material handling integration system, the automatic material handling system integration system having
a stocker for storing and sequencing a plurality of FOUPs, the stocker having an embedded sorter disposed therewithin for sorting wafers within the plurality of FOUPs, the embedded sorter having
at least four load ports, wherein two of the at least four embedded sorter load ports are stocker crane accessible load ports, the two stocker crane accessible load ports in operative communication with a FOUP transportation system for automatically transferring FOUPs from the stocker crane to at least one of the embedded sorter's two stocker crane accessible load ports according to a predefined sequence, and wherein two of the at least four embedded sorter load ports are operator accessible load ports, the embedded sorter's two operator accessible load ports are provided to allow for manual insertion of FOUPs by an operator into the embedded sorter.

18. The system of claim 17 further comprising:
a FOUP management system, wherein the FOUP management system manages a plurality of FOUPs.

19. The system of claim 17 further comprising:
a FOUP transportation system for transporting FOUPs within a wafer fabrication facility, the FOUP transportation system in operative communication with the stocker and in further operative communication with the real time dispatch system to route FOUPs to and from the embedded sorter.

20. The system of claim 17 further comprising:
a real time dispatch system in operative communication with the FOUP management system, wherein the real time dispatch system controls dispatching of wafer lot orders within a wafer fabrication system.

21. The system of claim 20 further comprising:
a manufacture execution system, the manufacture execution system in operative communication with the real time dispatch system for controlling recipe processing and for controlling flow of FOUPs within the FAB.

22. The system of claim 21 further comprising:
a computer integrated manufacturing system, the computer integrated manufacturing system for automating equipment, the computer integrated manufacturing system in operative communication with the stocker and with the manufacture execution system, wherein the computer integrated manufacturing is in further operative communication with the real time dispatch system.

23. The system of claim 22 wherein the stocker is in operative communication with the real time dispatch system and is in further operative communication with the computer integrated manufacturing system.

24. An automated material handling system comprising:
a FOUP management system, the FOUP management system for managing a plurality of FOUPs;
a real time dispatch system, the real time dispatch system for controlling dispatching of wafer lot orders within a wafer fabrication system, wherein the real time dispatch system is in operative communication with the FOUP management system,
an automatic material handling integration system, the automatic material handling system integration system having
a stocker for storing and sequencing a plurality of FOUPs, the stocker having
an embedded sorter disposed there within for sorting wafers within the plurality of FOUPs, wherein the stocker is in operative communication with the real time dispatch system and is in further operative communication with a computer integrated manufacturing system, the embedded sorter has at least four load ports, wherein two of the at least four embedded sorter load ports are stocker crane accessible load ports, the two stocker crane accessible load ports in operative communication with the FOUP transportation system for automatically transferring FOUPs from the stocker crane to at least one of the embedded sorter's two stocker crane accessible load ports according to a predefined sequence, and wherein two of the at least four embedded sorter load ports are operator accessible load ports, the embedded sorter's two operator accessible load ports are provided to allow for manual insertion of FOUPs by an operator into the embedded sorter, and wherein the embedded sorter operates to exchange wafers between the at least four embedded sorter load ports according to processing requirements of each lot disposed within a plurality of multiple lot FOUPB using a plurality of automated functions communicated to the embedded sorter automation system from a manufacture execution system to improve throughput and to reduce mis-operation, and
an embedded sorter automation system for controlling a FOUP operation scenario to be performed on a FOUP disposed within the embedded sorter, wherein the embedded sorter automation system operates to transfer at least one FOUP automatically from the stocker crane to at least one of the at least two stocker crane accessible load ports when the real time dispatch system is in an automated mode, wherein the embedded sorter automation system operates to transfer at least one FOUP manually from an operator to at least one of the at least two operator accessible load ports when the real time dispatch system is operating in a manual mode;
a FOUP transportation system for transporting FOUPs within a wafer fabrication facility, the FOUP transportation system in operative communication with the stocker and in further operative communication with the real time dispatch system to route FOUPs to and from the embedded sorter;
a manufacture execution system, the manufacture execution system in operative communication with the real time dispatch system for controlling recipe processing and for controlling flow of FOUPs within the FAB; and
a computer integrated manufacturing system, the computer integrated manufacturing system for automating equipment, the computer integrated manufacturing system in operative communication with the stocker and with the manufacture execution system, wherein the computer integrated manufacturing is in further operative communication with the real time dispatch.

25. An automated material handling system comprising:

a FOUP management system, the FOUP management system for managing a plurality of FOUPs;

a real time dispatch system, the real time dispatch system for controlling dispatching of wafer lot orders within a wafer fabrication system, wherein the real time dispatch system is in operative communication with the FOUP management system, an automatic material handling integration system, the automatic material handling system integration system having a stocker for storing and sequencing a plurality of FOUPs, the stocker having an embedded sorter disposed there within for sorting wafers within the plurality of FOUPs, wherein the stocker is in operative communication with the real time dispatch system and is in further operative communication with a computer integrated manufacturing system, and wherein the embedded sorter has at least four load ports, wherein two of the at least four embedded sorter load ports are stocker crane accessible load ports, the two stocker crane accessible load ports in operative communication with the FOUP transportation system for automatically transferring FOUPs from the stocker crane to at least one of the embedded sorter's two stocker crane accessible load ports according to a predefined sequence, and wherein two of the at least four embedded sorter load ports are operator accessible load ports, the embedded sorter's two operator accessible load ports are provided to allow for manual insertion of FOUPs by an operator into the embedded sorter, and an embedded sorter automation system for controlling a FOUP operation scenario to be performed on a FOUP disposed within the embedded sorter, wherein the embedded sorter automation system is capable of performing the FOUP operation scenario in accordance with instructions communicated to the embedded sorter from a manufacture execution system, the FOUP operation scenario selected from the group consisting of:

a FOUP separation scenario,
a FOUP exchange scenario,
a FOUP combination scenario,
a FOUP cleaning due scenario, and
a wafer map verification scenario, and
wherein the embedded sorter operates to exchange wafers between the at least four embedded sorter load ports according to processing requirements of each lot disposed within a plurality of multiple lot FOUPs using a plurality of automated functions communicated to an embedded sorter automation system from a manufacture execution system to improve throughput and to reduce mis-operation;

a FOUP transportation system for transporting FOUPs within a wafer fabrication facility, the FOUP transportation system in operative communication with the stocker and in further operative communication with the real time dispatch system to route FOUPs to and from the embedded sorter; and a manufacture execution system, the manufacture execution system in operative communication with the real time dispatch system for controlling recipe processing and for controlling flow of FOUPs within the FAB; and a computer integrated manufacturing system, the computer integrated manufacturing system for automating equipment, the computer integrated manufacturing system in operative communication with the stocker and with the manufacture execution system, wherein the computer integrated manufacturing is in further operative communication with the real time dispatch system.

* * * * *